United States Patent
Gallup et al.

(10) Patent No.: US 7,422,929 B2
(45) Date of Patent: Sep. 9, 2008

(54) WAFER-LEVEL PACKAGING OF OPTOELECTRONIC DEVICES

(75) Inventors: Kendra J. Gallup, Marina del Rey, CA (US); Frank S. Geefay, Cupertino, CA (US); Ronald Shane Fazzio, Loveland, CO (US); Martha Johnson, Graeley, CO (US); Carrie Ann Guthrie, Fort Collins, CO (US); Tanya Jegeris Snyder, Edna, MN (US); Richard C. Ruby, Menlo Park, CA (US)

(73) Assignee: Avago Technologies Fiber IP Pte Ltd, Singapore (SG)

( * ) Notice: Subject to any disclaimer, the term of this patent is extended or adjusted under 35 U.S.C. 154(b) by 109 days.

(21) Appl. No.: 11/071,550

(22) Filed: Mar. 2, 2005

(65) Prior Publication Data

US 2005/0142692 A1    Jun. 30, 2005

Related U.S. Application Data

(62) Division of application No. 10/666,363, filed on Sep. 19, 2003, now Pat. No. 6,953,990.

(51) Int. Cl.
*H01L 21/44* (2006.01)
*H01L 21/48* (2006.01)
*H01L 21/50* (2006.01)

(52) U.S. Cl. ............ 438/106; 438/22; 438/51; 438/64; 438/25; 257/E21.499; 257/E31.117; 257/E31.127

(58) Field of Classification Search .......... 438/22, 438/24, 25, 26, 43, 48, 51, 55, 57, 64, 723, 438/724, 679, 680, 740, 743, 744, 756, 757
See application file for complete search history.

(56) References Cited

U.S. PATENT DOCUMENTS

| 3,816,847 A | 6/1974 | Nagao |
| 4,307,934 A | 12/1981 | Palmer |
| 4,680,733 A | 7/1987 | Duforestel et al. |
| 4,847,848 A | 7/1989 | Inoue et al. |
| 4,966,430 A | 10/1990 | Weidel |
| 4,993,799 A | 2/1991 | Stein |

(Continued)

FOREIGN PATENT DOCUMENTS

DE            3834335 A1    12/1990

(Continued)

OTHER PUBLICATIONS

German Office Action dated Feb. 21, 2007; involving couterpart German Patent Application No. 10 2004 026 990.4-54.

(Continued)

*Primary Examiner*—David Nhu

(57) ABSTRACT

In an embodiment, the invention provides a method for forming a wafer-level package. A bonding pad is formed on a first wafer. After forming the bonding pad, an optoelectronic device is located on the first wafer. A gasket is formed on a second wafer. After a gasket is formed on a second wafer, the second wafer is attached to the first wafer with a bond between the gasket and the bonding pad.

20 Claims, 2 Drawing Sheets

U.S. PATENT DOCUMENTS

| | | | |
|---|---|---|---|
| 5,104,242 A | 4/1992 | Ishikawa | |
| 5,195,156 A | 3/1993 | Freeman et al. | |
| 5,390,271 A | 2/1995 | Priest | |
| 5,394,490 A * | 2/1995 | Kato et al. | 385/14 |
| 5,485,021 A * | 1/1996 | Abe | 257/14 |
| 5,512,860 A | 4/1996 | Huscroft et al. | |
| 5,513,289 A | 4/1996 | Hosokawa et al. | |
| 5,532,524 A | 7/1996 | Townsley et al. | |
| 5,552,918 A | 9/1996 | Krug et al. | |
| 5,565,672 A | 10/1996 | Siegel et al. | |
| 5,566,265 A | 10/1996 | Spaeth et al. | |
| 5,577,142 A | 11/1996 | Mueller-Fiedler et al. | |
| 5,578,863 A | 11/1996 | De Poorter | |
| 5,602,855 A | 2/1997 | Whetsel, Jr. | |
| 5,665,982 A | 9/1997 | Torikai | |
| 5,742,833 A | 4/1998 | Dea et al. | |
| 5,781,422 A | 7/1998 | Lavin et al. | |
| 5,801,402 A | 9/1998 | Shin | |
| 5,822,352 A | 10/1998 | Mizutani et al. | |
| 5,835,514 A | 11/1998 | Yuen et al. | |
| 5,867,620 A | 2/1999 | Bunin et al. | |
| 5,875,205 A * | 2/1999 | Spaeth et al. | 372/50 |
| 5,883,988 A | 3/1999 | Yamamoto et al. | |
| 5,912,872 A * | 6/1999 | Feldman et al. | 369/13.32 |
| 5,940,564 A | 8/1999 | Jewell | |
| 5,956,370 A | 9/1999 | Ducaroir et al. | |
| 5,981,945 A * | 11/1999 | Spaeth et al. | 250/239 |
| 5,998,982 A | 12/1999 | Groeneveld et al. | |
| 6,016,548 A | 1/2000 | Nakamura et al. | |
| 6,036,872 A | 3/2000 | Wood et al. | |
| 6,037,641 A * | 3/2000 | Goel | 257/432 |
| 6,047,380 A | 4/2000 | Nolan et al. | |
| 6,079,025 A | 6/2000 | Fung | |
| 6,085,048 A | 7/2000 | Mikoshiba et al. | |
| 6,085,328 A | 7/2000 | Klein et al. | |
| 6,089,456 A | 7/2000 | Walsh et al. | |
| 6,115,763 A | 9/2000 | Douskey et al. | |
| 6,126,325 A | 10/2000 | Yamane et al. | |
| 6,144,787 A | 11/2000 | Johnston et al. | |
| 6,187,211 B1 | 2/2001 | Smith et al. | |
| 6,201,829 B1 | 3/2001 | Schneider | |
| 6,228,675 B1 * | 5/2001 | Ruby et al. | 438/106 |
| 6,230,277 B1 | 5/2001 | Nakaoka et al. | |
| 6,234,687 B1 | 5/2001 | Hall et al. | |
| 6,243,508 B1 | 6/2001 | Jewell et al. | |
| 6,265,246 B1 * | 7/2001 | Ruby et al. | 438/113 |
| 6,274,890 B1 | 8/2001 | Oshio et al. | |
| 6,275,513 B1 | 8/2001 | Chang-Hasnain et al. | |
| 6,303,922 B1 | 10/2001 | Kasper | |
| 6,354,747 B1 | 3/2002 | Irie et al. | |
| 6,376,280 B1 | 4/2002 | Ruby et al. | |
| 6,416,238 B1 | 7/2002 | Gilliland et al. | |
| 6,422,766 B1 | 7/2002 | Althaus et al. | |
| 6,429,511 B2 * | 8/2002 | Ruby et al. | 257/704 |
| 6,445,514 B1 | 9/2002 | Ohnstein et al. | |
| 6,460,143 B1 | 10/2002 | Howard et al. | |
| 6,540,412 B2 | 4/2003 | Yonemura et al. | |
| 6,556,608 B1 | 4/2003 | Gilliland et al. | |
| 6,567,439 B1 | 5/2003 | Auracher et al. | |
| 6,567,590 B1 | 5/2003 | Okada et al. | |
| 6,599,666 B2 | 7/2003 | Rolfson | |
| 6,608,476 B1 | 8/2003 | Mirov et al. | |
| 6,652,158 B2 | 11/2003 | Bartur et al. | |
| 6,684,033 B1 | 1/2004 | Doh et al. | |
| 6,686,580 B1 | 2/2004 | Glenn et al. | |
| 6,731,882 B1 | 5/2004 | Althaus et al. | |
| 6,757,308 B1 | 6/2004 | Eldring et al. | |
| 6,759,723 B2 | 7/2004 | Silverbrook | |
| 6,774,404 B2 | 8/2004 | Imai | |
| 6,777,263 B1 * | 8/2004 | Gan et al. | 438/106 |
| 6,787,897 B2 * | 9/2004 | Geefay et al. | 257/704 |
| 6,801,196 B1 | 10/2004 | Bodley et al. | |
| 6,874,107 B2 | 3/2005 | Lesea | |
| 6,905,618 B2 | 6/2005 | Matthews et al. | |
| 6,919,222 B2 | 7/2005 | Geefay | |
| 6,947,224 B2 | 9/2005 | Wang et al. | |
| 6,956,992 B2 | 10/2005 | Coleman | |
| 6,977,960 B2 | 12/2005 | Takinosawa | |
| 6,979,810 B2 | 12/2005 | Chujo et al. | |
| 6,980,823 B2 | 12/2005 | Challa et al. | |
| 7,134,032 B2 | 11/2006 | Yamada et al. | |
| 2001/0023920 A1 | 9/2001 | Ando et al. | |
| 2002/0008326 A1 | 1/2002 | Mizusaki | |
| 2002/0101641 A1 | 8/2002 | Kurchuk | |
| 2002/0152408 A1 | 10/2002 | Inui et al. | |
| 2002/0179921 A1 | 12/2002 | Cohn | |
| 2003/0071283 A1 | 4/2003 | Heschel | |
| 2003/0089902 A1 | 5/2003 | Yue | |
| 2003/0116825 A1 | 6/2003 | Geefay | |
| 2003/0119308 A1 | 6/2003 | Geefay | |
| 2003/0142914 A1 | 7/2003 | Jewell et al. | |
| 2003/0160256 A1 | 8/2003 | Durocher et al. | |
| 2004/0086011 A1 | 5/2004 | Bhandarkar | |
| 2004/0190836 A1 | 9/2004 | Kilian | |
| 2005/0019042 A1 | 1/2005 | Kaneda | |
| 2005/0052255 A1 | 3/2005 | Chiang | |
| 2005/0058222 A1 | 3/2005 | Black et al. | |
| 2005/0134349 A1 | 6/2005 | Krishnaswami | |
| 2005/0191059 A1 | 9/2005 | Swenson et al. | |
| 2006/0115280 A1 | 6/2006 | Chang | |
| 2007/0019966 A1 | 1/2007 | Chiu et al. | |
| 2007/0047963 A1 | 3/2007 | Dallesasse | |
| 2007/0127929 A1 | 6/2007 | Nishihara et al. | |
| 2007/0154147 A1 | 7/2007 | Weem | |
| 2007/0154225 A1 | 7/2007 | Schulz | |
| 2007/0166047 A1 | 7/2007 | Berger | |
| 2007/0206964 A1 | 9/2007 | Lee et al. | |

FOREIGN PATENT DOCUMENTS

| | | |
|---|---|---|
| DE | 4440935 A1 | 5/1996 |
| DE | 19810624 | 3/1998 |
| DE | 19508222 | 6/1998 |
| DE | 19823691 | 12/1999 |
| DE | 10150401 | 10/2001 |
| EP | 0366974 A1 | 7/1989 |
| EP | 0713113 | 5/1996 |
| EP | 0942302 | 9/1999 |
| EP | 1104113 | 5/2001 |
| EP | 1146570 | 10/2001 |
| EP | 1187373 A2 | 3/2002 |
| EP | 1199697 | 4/2002 |
| EP | 1187373 A3 | 1/2005 |
| JP | 2007/020008 | 1/2007 |
| WO | WO-98/50810 A1 | 11/1998 |
| WO | WO-01/01497 | 1/2001 |

OTHER PUBLICATIONS

English translation of German Office Action dated Feb. 21, 2007 involving counterpart German Patent Application No. 10 2004 026 990.4-54.

Agilent Technologies, Inc., "Gigabit Ethernet and Fibre Channel SerDes ICs", *Technical Data Sheet*, (Apr. 2000).

Lee, Chien C., et al., "Silicon-Based Transmissive Diffractive Optical Element", Optics Letters, vol. 28, No. 14, Optical Society of America. (Jul. 15, 2003),1260-1262.

"German Office Action involving counterpart German Patent Application", No. 102004025775, (Feb. 16, 2007),2-54.

"English Translation of German Office Action involving counterpart German Patent Application", No. 102004025775, (Feb. 16, 2007),2-54.

"German Office Action; involving counterpart German Patent Application", No. 10 2004 028 117, (Nov. 2, 2006),3-54.

"English translation of German Office Action; involving counterpart German Patent Application", No. 10 2004 028 117, (Nov. 2, 2006),3-54.

"German Office Action; involving counterpart German Patent Application", No. 10 2004 028 117, (Mar. 20, 2007),3-54.

"English translation of German Office Action; involving German Patent", No. 10 2004 028 117, (Mar. 20, 2007),3-54.

Pallotta, Andrea et al., "A Low-Power Clock and Data Recovery Circuit for 2.5 Gb/s SDH Receivers", ISLPED, Rapallo, Italy, (2000),67-72, dated 2000.

Takeshita, T. "A 622Mb/s Fully-Integrated Optical IC with a Wide Range Input", IEEE, International Solid-State Circuits Conference, (2002), dated 2002.

Sklar, B. "Digital Communications: Fundamentals and Applications", 2nd Ed., Upper Saddle River, NJ: Prentice Hall PTR, (2001), dated 2001.

Sialm, et al., "Ultra-Fast CMOS Transceiver Design for Optical Interconnect Applications", Website: www.ife.eee.ethz.ch/rfic/Link:_Gbit/s_Optolink, dated 2003.

Pepeljugoski, P. et al., "Improved Performance of 10 Gb/s Multimode Fiber Optic Links Using Equalization", Optical Fiber Communications Conference, OFC 2003, vol. 2., (Mar. 23-38, 2003),472-474.

Kim, S.E. "CMOS optical receiver chipset for gigabit ethernet applications.", Proceedings of the 2003 International Symposium on Circuits and Systems, ISCAS '03., vol. 1: 1-29 to 1-32.,(May 2003),25-28.

* cited by examiner

WAFER-LEVEL PACKAGING OF OPTOELECTRONIC DEVICES

CROSS-REFERENCE TO RELATED APPLICATIONS

This is a divisional application of application Ser. No. 10/666,363, filed on Sep. 19, 2003, now U.S. Pat. No. 6,953,990 issued Oct. 11, 2005, the entire disclosure of which is incorporated herein by reference.

FIELD OF INVENTION

This invention relates to wafer-level packaging of optoelectronic devices.

DESCRIPTION OF RELATED ART

Optoelectronic (OE) devices are generally packaged as individual die. This means of assembly is often slow and labor intensive, resulting in higher product cost. Thus, what is needed is a method to improve the packaging of OE devices.

SUMMARY

In one embodiment of the invention, a wafer-level package includes a first wafer comprising a bonding pad, an optoelectronic device on the first wafer, and a second wafer comprising a gasket. The second wafer is attached to the first wafer by a bond between the gasket and the bonding pad.

BRIEF DESCRIPTION OF THE DRAWINGS

Use of the same reference symbols in different figures indicates similar or identical items. The cross-sectional figures are not drawn to scale and are only for illustrative purposes.

DETAILED DESCRIPTION

Figure 1:
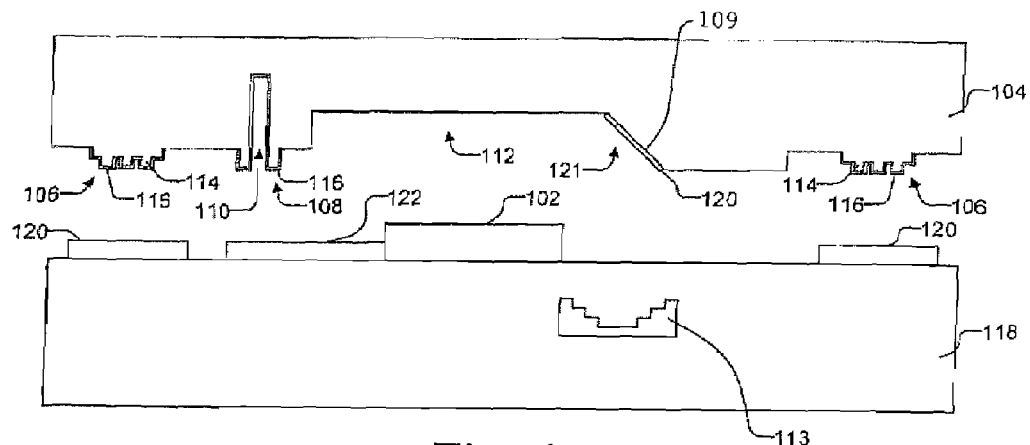
FIGS. 1, 2, and 3 are cross-sections of a wafer-level package of an optoelectronic device in one embodiment of the invention.
Figure 2:
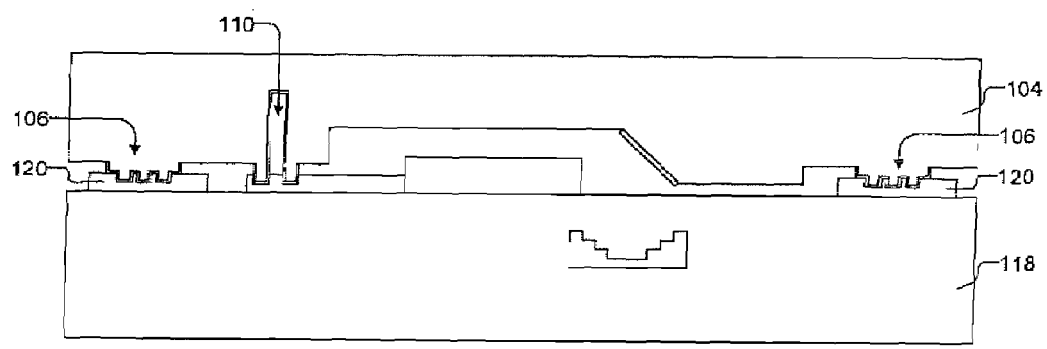
Figure 3:
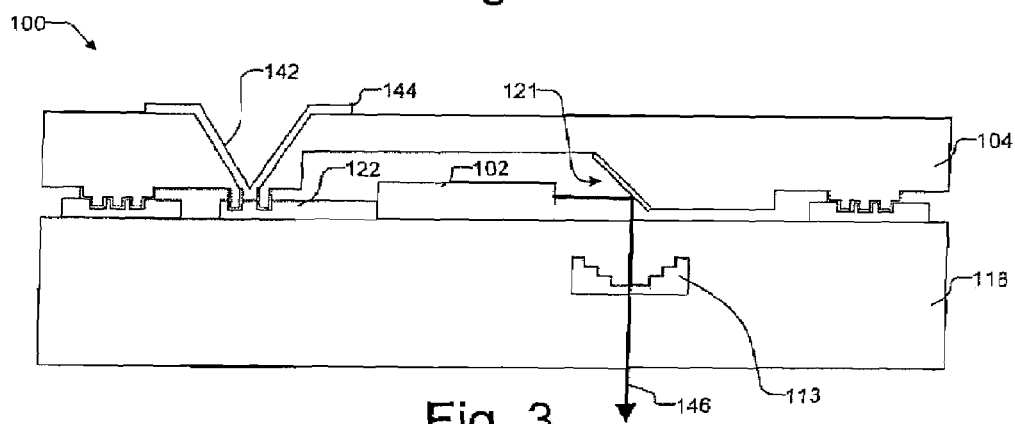

FIGS. 1, 2, and 3 are cross-sections of a wafer-level package 100 (FIG. 3) for an optoelectronic device 102 in one embodiment of the invention. Referring to FIG. 1, package 100 includes a cap wafer 104 having gaskets 106 and 108, a via 110, and a cavity 112.

Cap wafer 104 can be silicon (Si), gallium arsenide (GaAs), indium phosphide (InP), or other similar materials.

Gasket 106 forms a perimeter around package 100 while gasket 108 forms a perimeter around via 110. Depending on the application, gasket 106 can include treads 114. In one embodiment, gaskets 106 and 108 are formed by masking and etching cap wafer 104. Alternatively, gaskets 106 and 108 can be deposited onto cap wafer 104 and then patterned by masking and etching or liftoff.

The surface of gaskets 106 and 108 are covered with a bonding layer 116. In one embodiment, bonding layer 116 is gold (Au) deposited by sputtering, evaporation, or plating, and patterned by masking and etching or liftoff. A barrier metal layer (not shown) can be formed between bonding layer 116 and gaskets 106 and 108 to act as a diffusion barrier and to improve adhesion between the bonding layer material and the cap wafer material.

Cavity 112 includes an angled surface 109. In one embodiment, cavity 112 is formed by masking and etching cap wafer 104. Surface 109 is covered with a reflective layer 120 to form a mirror 121. In one embodiment, reflective layer 120 is Au deposited by sputtering, evaporation, or plating, and patterned by masking and etching or liftoff. Like bonding layer 116, a barrier metal layer can be deposited between reflective layer 120 and surface 109 to act as a diffusion barrier and to improve adhesion. If bonding material 116 and reflective material 120 are the same material, they can be deposited at the same time.

Package 100 further includes a base wafer 118 having an integrated lens 113, a bonding pad 120, and a contact pad 122. Base wafer 118 can be Si, GaAs, InP, or other similar materials.

In one embodiment, integrated lens 113 is a diffractive optical element (DOE) that is formed as part of base wafer 118. DOE 113 can be patterned from a stack of phase shifting layers separated by etch stop layers to the desired lens shape. The phase shifting layers can be amorphous silicon ($\alpha$-Si) and the etch stop layers can be silicon dioxide ($SiO_2$). Alternatively, the phase shifting layers can be silicon nitride ($Si_3N_4$) instead of amorphous silicon.

To form the stack, an amorphous silicon layer is first formed on substrate 118. The amorphous silicon layer can be deposited by low pressure chemical vapor deposition (LPCVD) or by plasma enhanced chemical vapor deposition (PECVD). A silicon dioxide ($SiO_2$) layer is next formed on the amorphous silicon layer. The silicon dioxide layer can be thermally grown on the amorphous silicon layer in steam at 550° C. or deposited by PECVD. The process of forming the amorphous silicon and silicon dioxide layers is repeated for the desired number of phase shift layers. Once the stack is formed, the amorphous silicon layer is masked and then etched down to the next silicon dioxide layer, which acts as the etch stop. The process of masking and etching is repeated for the remaining phase shifting layers to form DOE 113.

Bonding pad 120 forms a perimeter around package 100 corresponding to gasket 106. Contact pad 122 provides an electrical connection to optoelectronic device 102. In one embodiment, bonding pad 120 and contact pad 122 are Au deposited by sputtering, evaporation, or plating, and patterned by masking and etching or liftoff. A barrier metal layer (not shown) can be formed between base wafer 118 and pads 120 and 122 to act as a diffusion barrier and to improve adhesion between the pad material and the base wafer material.

Optoelectronic device 102 is located on base wafer 118. Optoelectronic device 102 is electrically connected to contact pad 122 by a wire bond, a solder bump bond, a flip chip technique, or other attachment techniques. Depending on the embodiment, optoelectronic device 102 can be an edge-emitting laser (e.g., a Fabry-Perot or a distributed feedback (DFB) laser) or a vertical cavity surface-emitting laser (VCSEL). If it is an edge-emitting laser, optoelectronic device 102 is typically a separate die that is aligned and bonded to base wafer 118. If it is a VCSEL, optoelectronic device 102 can be grown directly on base wafer 118.

Base wafer 118 can include additional elements, such as a power monitor (e.g., a photodiode), leads (e.g., buried traces) for electrical connectivity, and other active and passive circuitry.

Referring to FIG. 2, cap wafer 104 is aligned and bonded to base wafer 118. Depending on the embodiment, the seal between cap wafer 104 and base wafer 118 may or may not be hermetic.

In one embodiment, an Au/Au thermocompression bond is formed between gasket 106 and bonding pad 120. This thermocompression bond is formed by simultaneously applying both temperature and pressure for a predetermined time (e.g., between 30 to 120 megapascals from 320 to 400° C. for 2 minutes to 1 hour). In this embodiment, the barrier metal layer for Au on gasket 106 and bonding pad 120 can be (1) a titanium tungsten (TiW)/titanium tungsten nitrogen oxide (TiWNO)/TiW tri-layer, (2) titanium/platinum bi-layer, (3) chromium/platinum bi-layer, (4) tungsten silicon nitride, (5) titanium silicon nitride, (6) silicon dioxide/titanium bi-layer, (7) silicon dioxide/chromium bi-layer, or (8) silicon dioxide/ titanium tungsten bi-layer. The barrier metal layer can be deposited by sputtering or evaporation and patterned by masking and etching or liftoff. The barrier metal layer should provide a good diffusion barrier and act as a good adhesion layer between Au and Si, which in-turn yields a clean Au/Au bond.

In another embodiment, an Au/Si reaction bond is formed between gasket 106 and bonding pad 120. This reaction bond is formed by simultaneously applying both temperature and pressure for a predetermined time (e.g., between 60 to 120 megapascals from 300 to 365° C. for 5 to 30 minutes). In this embodiment, the barrier metal layer is replaced with an adhesion layer such as Ti so Au and Si on cap wafer 104 and base wafer 118 can interdiffuse and react to form a bond consisting of a gold-silicon mixture.

In yet another embodiment, an Au/Sn solder bond is formed between gasket 106 and bonding pad 120.

The choice of the bonding material and the type of the bond between cap wafer 104 and base wafer 118 depends on a number of factors, including adhesion requirements, hermeticity requirements, and the ability of optoelectronic device 102 and other integrated electronics to tolerate bonding conditions. For example, if optoelectronic device 102 is an edge-emitter laser attached to base wafer 118 by a solder bond, then a thermocompression bond at a high temperature can lead to solder reflow that causes the laser to misalign. Consequently, a solder bond for the cap wafer 104 may be more appropriate.

Referring to FIG. 3, a via contact (or plug) 142 and a via contact pad 144 are formed to provide an electrical connection to optoelectronic device 102. In one embodiment, the topside of cap wafer 104 is grinded to expose via 110 (FIGS. 1 and 2). Via 110 is then widened by an isotropic etch. Metal is then formed in and around via 110 to form via contact 142 and contact pad 144, which are electrically connected to contact pad 122. In one embodiment, a metal barrier/adhesion layer is deposited by sputtering or evaporation on cap wafer 104 and sidewalls of via 110 and then patterned by masking and etching or liftoff. Via contact 142 and contact pad 142 are next formed by electroplating Au over the metal barrier/adhesion layer. Alternatively, via contact 142 is Au deposited by sputtering or, evaporation. Contact pad 144 can then be patterned by masking and etching or liftoff to form the desired shape.

In one embodiment, an edge-emitting laser 102 emits a light 146 that is reflected downward by mirror 121. Light 146 then exits package 100 through base wafer 118. If base wafer 118 is silicon, then package 100 is applicable to a single-mode transmitter operating in the 1300 nm regime in which silicon base wafer 118 is transparent.

Figure 4:
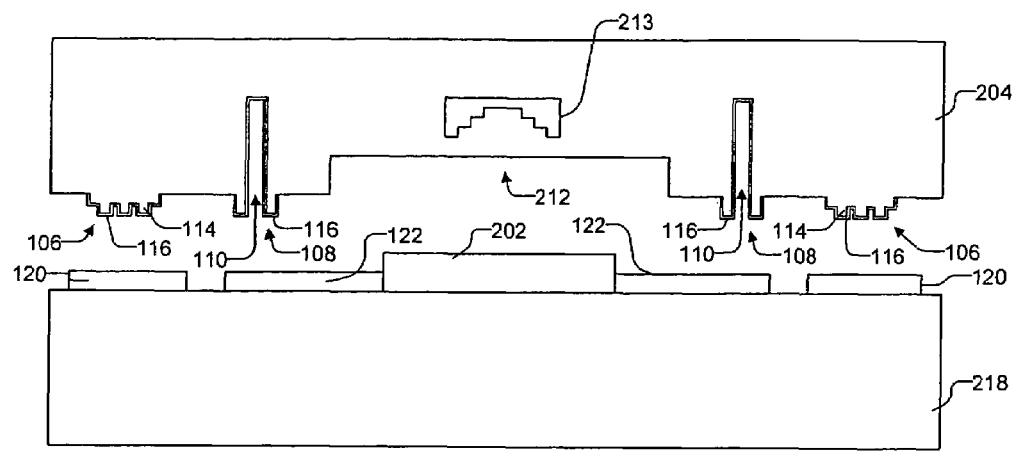
FIGS. 4, 5, and 6 are cross-sections of a wafer-level package of an optoelectronic device in another embodiment of the invention.
Figure 5:
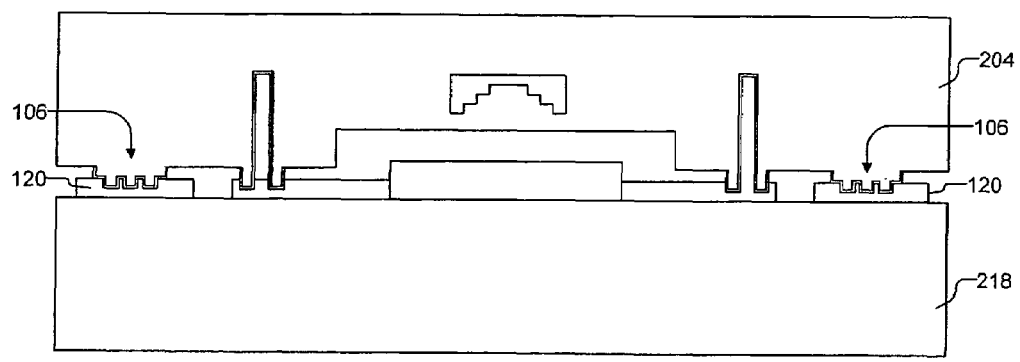
Figure 6:
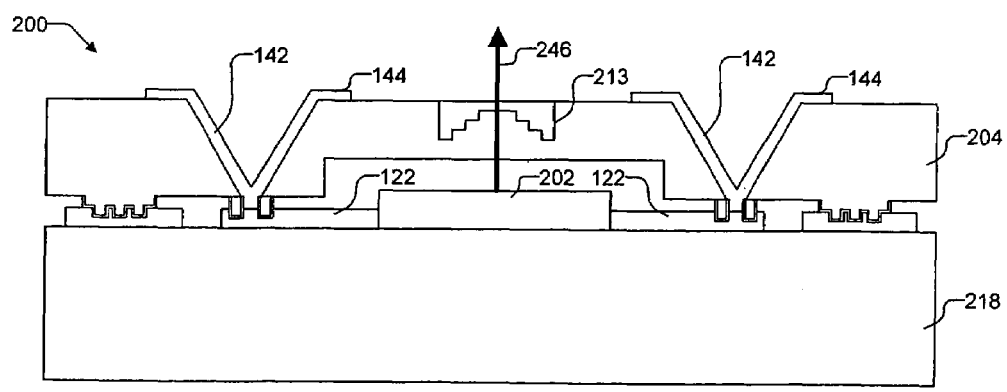

FIGS. 4, 5, and 6 are cross-sections of a wafer-level package 200 (FIG. 6) for an optoelectronic device 202 in one embodiment of the invention.

Referring to FIG. 4, package 200 includes a cap wafer 204 having gaskets 106 and 108, vias 110, a cavity 212, and an integrated lens 213.

Cap wafer 204 can be Si, GaAs, InP, or other similar materials. Gaskets 106 and 108 and via 110 are formed as described above. Cavity 212 is formed by masking and etching cap wafer 204.

In one embodiment, integrated lens 213 is a diffractive optical element (DOE) that is formed as part of cap wafer 204 as described above with integrated lens 113.

Referring to FIG. 4, package 100 further includes a base wafer 218 having bonding pad 120 and contact pads 122. Bonding pad 120 and contact pads 122 are formed as described above.

Optoelectronic device 202 is located on base wafer 218. Depending on the embodiment, optoelectronic device 202 can be an edge-emitting laser (e.g., Fabry-Perot or DFB) or a VCSEL. If it is an edge-emitting laser, optoelectronic device 202 is aligned and bonded to base wafer 218. If it is a VCSEL, optoelectronic device 202 can be grown directly on base wafer 218.

Base wafer 218 can include additional elements, such as a power monitor (e.g., a photodiode), leads (e.g., buried traces) for electrical connectivity, and other active and passive circuitry.

Referring to FIG. 5, cap wafer 204 is aligned and bonded to base wafer 218. Gasket 106 can be bonded to bonding pad 120 by a thermocompression, a reaction bond, or a solder bond as described above.

Referring to FIG. 6, via contacts 142 and via contact pads 144 are formed to provide electrical connections to optoelectronic device 202. Via contacts 142 and contact pads 144 are formed as described above.

As shown in FIG. 6, a VCSEL 202 emits a light 246 through DOE 213 in cap wafer 204. If cap wafer 204 is silicon, then package 200 is applicable to a single-mode transmitter operating in the 1300 nm regime in which silicon is transparent.

There are a number of advantages to the invention described above over currently existing packaging techniques. These include, but are not limited to, reduced labor costs with a significant reduction in product cost, potentially faster cycle times, and the ability to easily scale to high volume manufacturing.

Various other adaptations and combinations of features of the embodiments disclosed are within the scope of the invention. Numerous embodiments are encompassed by the following claims.

What is claimed is:

1. A method for forming a wafer-level package, comprising:
   forming a bonding pad on a first wafer;
   locating a light-emitting device on the first wafer;
   forming a gasket on a second wafer;
   forming an integrated lens as part of one of the first and the second wafers; and
   attaching the second wafer to the first wafer with a bond between the gasket and the bonding pad.

2. The method of claim 1, wherein said locating the light-emitting device comprises one of attaching the light-emitting device on the first wafer and forming the light-emitting device on the first wafer.

3. The method of claim 1, further comprising forming a mirror in the second wafer for reflecting a light from the light-emitting device through the integrated lens in the first wafer.

4. The method of claim 1, further comprising:
 forming a contact pad on the first wafer; and
 forming a via contact through the second wafer and coupled to the contact pad.

5. The method of claim 1, further comprising forming a cavity in the second wafer for accommodating the light-emitting device.

6. The method of claim 1, further comprising forming a bonding layer on the gasket, wherein the bond between the bonding layer and the bonding pad comprises a thermocompression bond.

7. The method of claim 6, further comprising forming a barrier metal layer between at least one of (1) the bonding layer and the gasket, and (2) the bonding pad and the first wafer.

8. The method of claim 1, wherein the bond is selected from the group consisting of a reaction bond and a solder bond.

9. The method of claim 1, further comprising forming a treaded surface on the gasket.

10. The method of claim 1, wherein the light-emitting device is selected from the group consisting of an edge-emitting laser and a vertical cavity surface-emitting laser (VCSEL).

11. The method of claim 1, wherein the integrated lens comprises a diffractive optical element.

12. A method for forming a wafer-level package, comprising:
 forming a bonding pad on a first wafer;
 locating a light-emitting device on the first wafer;
 forming a gasket on a second wafer;
 forming a mirror in the second wafer for reflecting a light from the light-emitting device through the first wafer; and
 attaching the second wafer to the first wafer with a bond between the gasket and the bonding pad.

13. The method of claim 12, wherein said locating the light-emitting device comprises one of attaching the light-emitting device on the first wafer and forming the light-emitting device on the first wafer.

14. The method of claim 12, further comprising:
 forming a contact pad on the first wafer; and
 forming a via contact through the second wafer and coupled to the contact pad.

15. The method of claim 12, further comprising forming a cavity in the second wafer for accommodating the light-emitting device.

16. The method of claim 12, further comprising forming a bonding layer on the gasket, wherein the bond between the bonding layer and the bonding pad comprises a thermocompression bond.

17. The method of claim 16, further comprising forming a barrier metal layer between at least one of (1) the bonding layer and the gasket, and (2) the bonding pad and the first wafer.

18. The method of claim 12, wherein the bond is selected from the group consisting of a reaction bond and a solder bond.

19. The method of claim 12, further comprising forming a treaded surface on the gasket.

20. The method of claim 12, wherein the light-emitting device is selected from the group consisting of an edge-emitting laser and a vertical cavity surface-emitting laser (VCSEL).

* * * * *